United States Patent
Asano et al.

(10) Patent No.: US 8,111,220 B2
(45) Date of Patent: Feb. 7, 2012

(54) EL DEVICE

(75) Inventors: Motohiko Asano, Shiga (JP); Shinji Takasugi, Kanagawa (JP); Keigo Kanoh, Kanagawa (JP); Daisuke Ota, Shiga (JP); Taro Hasumi, Kanagawa (JP); Hiromutsu Ogawa, Shiga (JP); Shinichi Abe, Shiga (JP)

(73) Assignee: LG Display Co., Ltd., Seoul (KR)

( * ) Notice: Subject to any disclaimer, the term of this patent is extended or adjusted under 35 U.S.C. 154(b) by 860 days.

(21) Appl. No.: 12/223,394

(22) PCT Filed: Dec. 26, 2006

(86) PCT No.: PCT/JP2006/325838
§ 371 (c)(1),
(2), (4) Date: Jul. 30, 2008

(87) PCT Pub. No.: WO2007/088690
PCT Pub. Date: Aug. 9, 2007

(65) Prior Publication Data
US 2009/0273589 A1      Nov. 5, 2009

(30) Foreign Application Priority Data

Jan. 31, 2006   (JP) .................................. 2006-023246
Apr. 27, 2006   (JP) .................................. 2006-123151
Oct. 30, 2006   (JP) .................................. 2006-293988

(51) Int. Cl.
*G09G 3/30*         (2006.01)

(52) U.S. Cl. .......................................... 345/76; 345/204
(58) Field of Classification Search ............. 345/76–84, 345/204–215
See application file for complete search history.

(56) References Cited

U.S. PATENT DOCUMENTS

| 7,952,862 | B2* | 5/2011 | Sakai ........................ 361/679.21 |
| 2009/0213534 | A1* | 8/2009 | Sakai ........................ 361/679.21 |
| 2010/0060675 | A1* | 3/2010 | Ko et al. ....................... 345/691 |
| 2010/0259715 | A1* | 10/2010 | Tanaka et al. .................. 349/143 |

FOREIGN PATENT DOCUMENTS

| JP | 11-84334 A | 3/1999 |
| JP | 2003-257624 A | 9/2003 |
| JP | 2005-267983 A | 9/2005 |

* cited by examiner

*Primary Examiner* — Vijay Shankar
(74) *Attorney, Agent, or Firm* — Birch, Stewart, Kolasch & Birch, LLP

(57) ABSTRACT

An EL device includes a substrate having a square shape, an element-forming region provided on an upper surface of the substrate and having organic light-emitting elements, a protruding section arranged in a region between the element-forming region and an end portion of the substrate, and a protection film deposited in a region extending from the element-forming region to the end portion of the substrate and disposed so as to cover the protruding section. The protruding section is disposed in a substantially strip-like shape along at least two of four sides of the substrate.

22 Claims, 13 Drawing Sheets

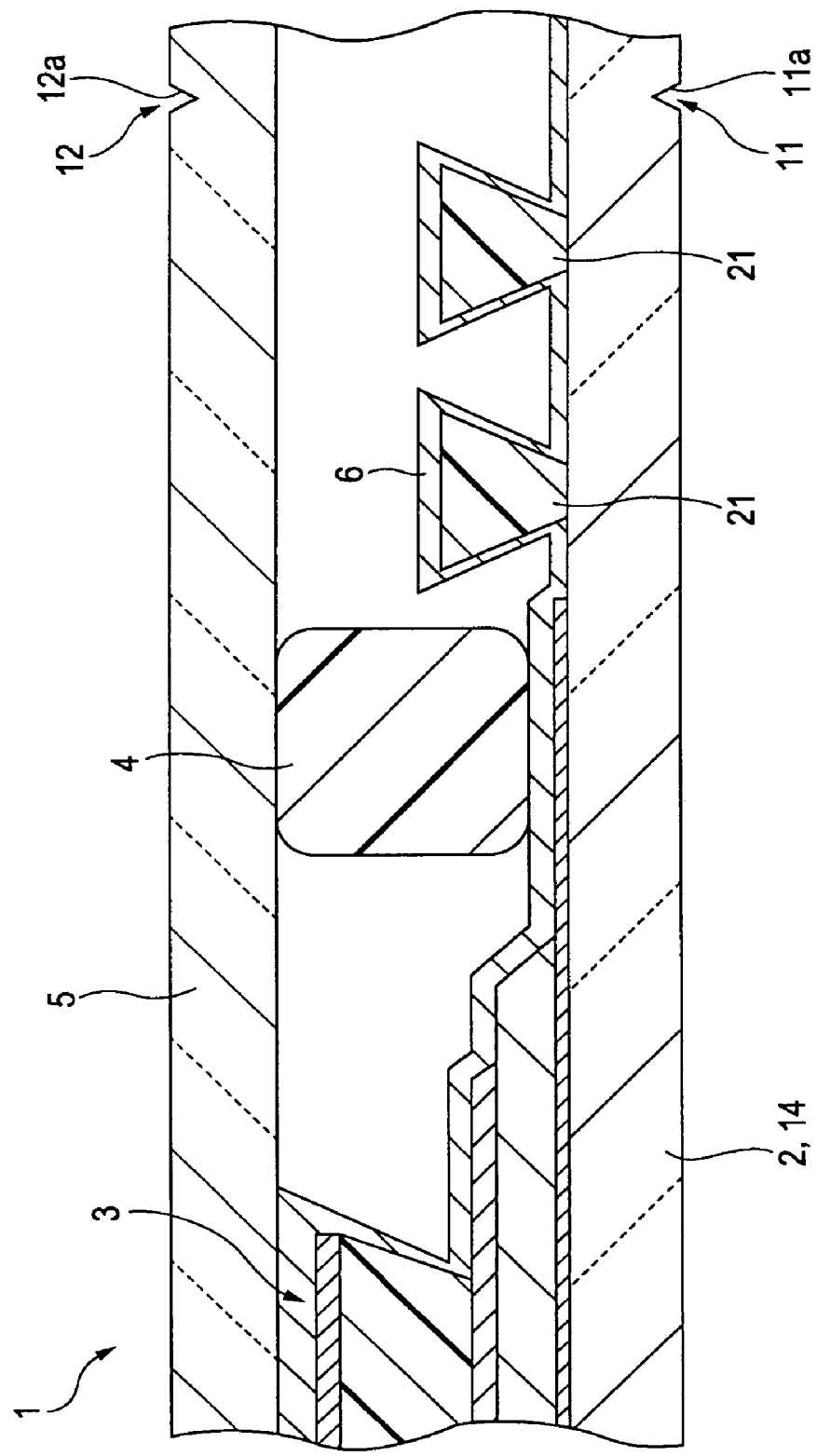

US 8,111,220 B2

EL DEVICE

BACKGROUND OF THE INVENTION

1. Field of the Invention

The present invention relates to an electroluminescent (EL) device, such as an organic EL display.

2. Description of the Related Art

An EL device, such as an organic EL display, is generally fabricated by a method in which a plurality of EL devices are formed at the same time on a mother substrate, and by dividing the mother substrate, the plurality of EL devices are obtained. In the dividing step, the mother substrate is partially cut along a dividing line, and an impact, external force or the like is applied to the partially cut portion so that the mother substrate is broken along the dividing line. Another dividing method may be used in which laser irradiation is performed along a dividing line of the mother substrate to locally heat the mother substrate, thereby causing cracks or the like, and dividing the mother substrate.

Meanwhile, in an EL device, in order to protect organic layers including organic materials etc. from the outside, a protection film including silicon nitride or the like is disposed over a substrate so as to cover an element region.

SUMMARY OF THE INVENTION

However, there may be a case where cracks are made in the protection film that protects organic layers, etc. by an impact, external force or the like. The impact, external force or the like is applied to the mother substrate when the mother substrate is divided or is applied to the EL device when the device is transported. The cracks may extend to the element region located at an inner region of the surface of the substrate. (The state in which cracks are made is described in detail later with reference to FIGS. 1 and 2.)

It is an object of the present invention to provide an EL device in which cracks made in a protection film can be satisfactorily prevented from reaching an element region at an inner region of the surface of a substrate.

According to a first aspect of the invention, an EL device includes a substrate having a quadrilateral shape, an element region provided on a side of an upper surface of the substrate and having organic light-emitting elements, a protruding section between the element region and an end portion of the substrate, and a protection film in a region extending from the element region to the end portion of the substrate, covering the protruding section. The protruding section has a substantially elongated shape along at least two of four sides of the substrate.

In the EL device, preferably, the protruding section includes a resin.

In the EL device, preferably, the protruding section has sidewalls that are inclined such that the bottom of the protruding section has a smaller width than the top of the protruding section.

In the EL device, preferably, the protruding section is continuous along the four sides of the substrate.

Preferably, the EL device further includes a driver arranged along at least one of the four sides of the substrate and arranged between the element region and the end portion of the substrate, the driver driving the organic light-emitting elements, and the protruding section is along two or more sides of the substrate not provided with the driver.

In the EL element, preferably, a plurality of the protruding section are disposed along at least two of the four sides of the substrate in a plurality of lines.

In the EL device, preferably, the height of the protruding section is larger than the thickness of the protection film.

In the EL device, preferably, the substrate is obtained by dividing a mother substrate, and the sides of the substrate correspond to dividing lines when the mother substrate is divided.

According to a second aspect of the invention, an EL device includes a substrate, an element region provided on a side of an upper surface of the substrate, having organic light-emitting elements, a protruding section arranged between the element region and an end portion of the substrate, the protruding section including a resin, and a protection film in a region extending from the element region to the end portion of the substrate, covering the protruding section. The protruding section has a substantially elongated shape along the end portion of the substrate.

According to a third aspect of the invention, an EL device includes a substrate, an element region provided on a side of an upper surface of the substrate, having organic light-emitting elements, a protruding section arranged between the element region and an end portion of the substrate, and a protection film in a region extending from the element region to the end portion of the substrate, covering the protruding section. The protruding section has sidewalls that are inclined so that the bottom of the protruding section has a smaller width than the top of the protruding section.

According to a fourth aspect of the invention, an EL device includes a substrate, an element region on a side of an upper surface of the substrate, having organic light-emitting elements, a recessed section between the element region and an end portion of the substrate, and a protection film in a region extending from the element region to the end portion of the substrate, covering an inner surface of the recessed section. The recessed section has a substantially elongated shape along the end portion of the substrate.

In the EL device, preferably, the depth of the recessed section is larger than the thickness of the protection film.

In any of the EL devices according to the first to third aspects of the invention, preferably, the element region is surrounded by a sealing member, and the protruding section is closer to the end portion of the substrate than the sealing member.

In any of the EL devices according to the fourth aspect of the invention, preferably, the element region is surrounded by a sealing member, and the recessed section is closer to the end portion of the substrate than the sealing member.

In the EL device according to any one of the first to third aspects of the invention, preferably, the element region further includes a partition wall between two adjacent organic light-emitting elements, each of the partition wall and the protruding section has a reverse tapered cross-section in which the lower surface has a smaller width than the upper surface, and a difference between the width of the upper surface and the width of the lower surface in the protruding section is larger than a difference between the width of the upper surface and the width of the lower surface in the partition wall.

According to a fifth aspect of the invention, an EL device includes a substrate, an element region on a side of an upper surface of the substrate, having organic light-emitting elements, a protruding section between the element region and an end portion of the substrate, and a protection film in a region extending from the element region to the end portion of the substrate, covering the protruding section. The protruding section is along the end portion of the substrate.

In the EL device, preferably, the protruding section includes a resin.

In the EL device, preferably, the protruding section has sidewalls that are inclined such that the bottom of the protruding section has a smaller width than the top of the protruding section.

In the EL device, preferably, the protruding section is continuous along the end portion of the substrate.

In the EL device, preferably, a plurality of the protruding section is disposed along the substrate in a plurality of lines.

In the EL device, preferably, the thickness of the protruding section is larger than the thickness of the protection film on the protruding section.

In the EL device, preferably, the element region is surrounded by a sealing member, and the protruding section is covered with the sealing member.

According to a sixth aspect of the invention, an EL device includes a substrate, an element region on a side of an upper surface of the substrate, having organic light-emitting elements, a recessed section between the element region and an end portion of the substrate, a protection film in a region extending from the element region to the end portion of the substrate, covering an inner surface of the recessed section, and a sealing member surrounding the element region. The recessed section is covered with the sealing member.

According to a seventh aspect of the invention, a manufacturing method of an EL device includes providing a substrate having a negative resist film thereon and a mask having an opening through which light is to pass and a halftone region which the amount of light to pass through is smaller than the amount of light to pass through the opening; arrange the mask opposite to the resist film on the substrate; irradiating the resist film with light through the mask; and developing the resist film to form the partition wall under the halftone, the partition wall having a reverse tapered shape in which the lower portion of the partition wall has a smaller width than the upper portion of the partition wall.

According to the present invention, cracks made in the protection film in the end portion of the substrate can be satisfactorily reduced by the protruding section, and the EL device can be effectively prevented from being destroyed.

BRIEF DESCRIPTION OF THE DRAWINGS

FIG. 7 is a cross-sectional view showing a structure in which two protruding sections are provided;

DESCRIPTION OF THE PREFERRED EMBODIMENTS

Cracks Generated in Protection Film

Prior to the detailed description of the preferred embodiments, cracks in a protection film generated at dividing a mother substrate is described.

Figure 1:
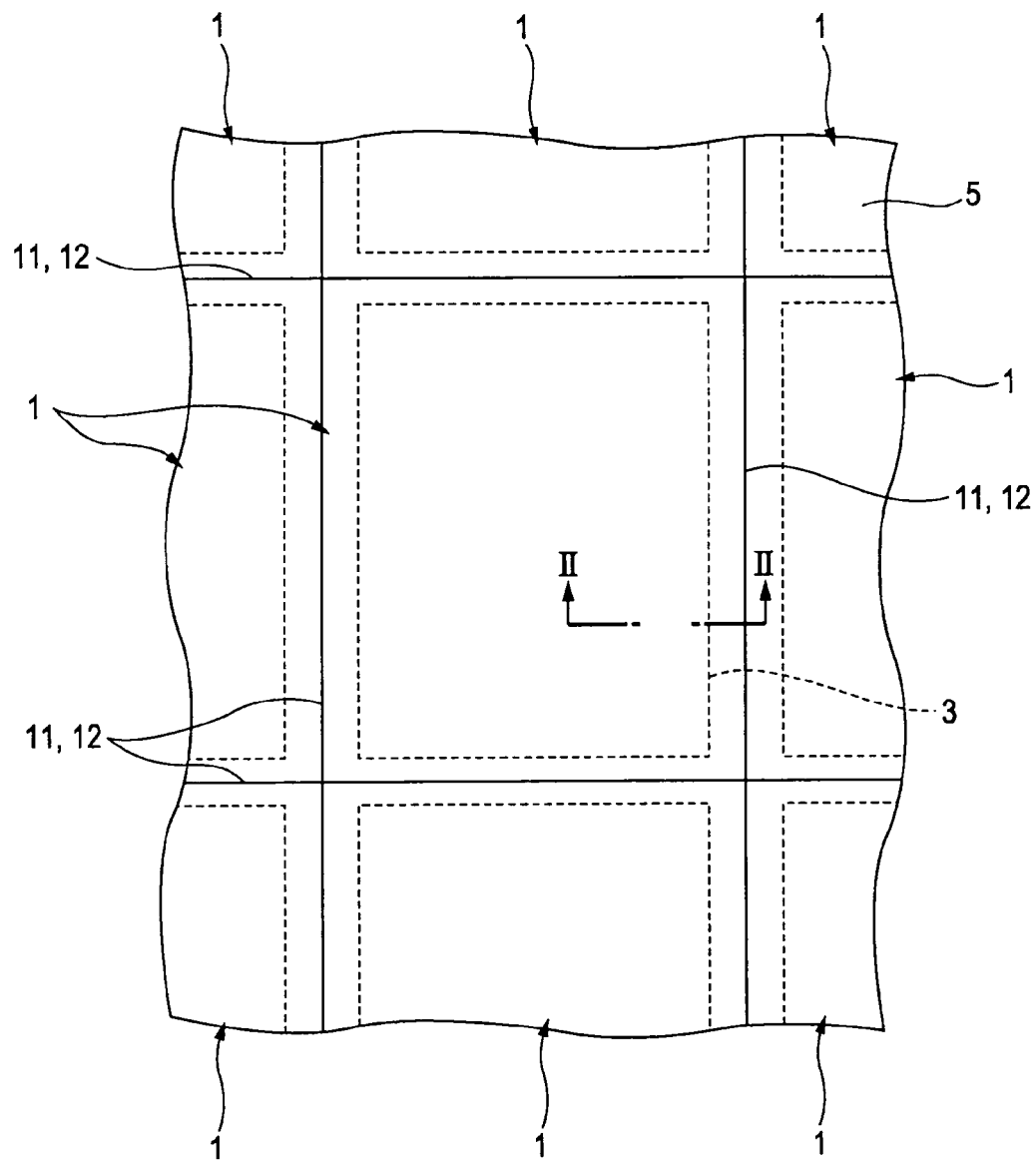
FIG. 1 is a plan view illustrating cracks occurring in a protection film.
Figure 2:
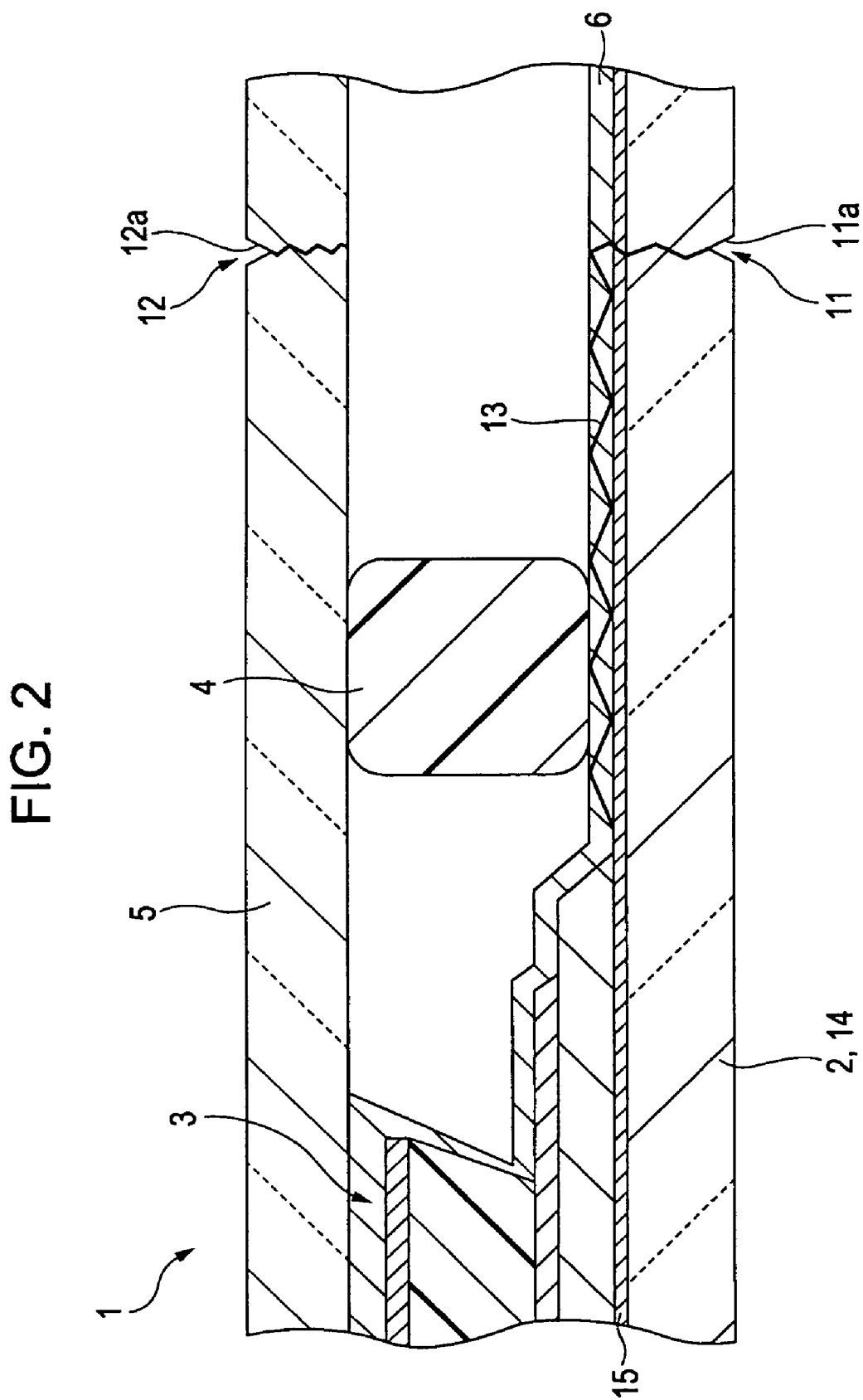
FIG. 2 is a cross-sectional view taken along the line II-II of FIG. 1.

In the fabrication process of an EL device 1, as shown in FIGS. 1 and 2, structures (including organic light-emitting elements, conductive lines, partition walls, etc.) corresponding to a plurality of EL devices 1 are formed at the same time using a mother substrate 2 including glass or the like. Then, the mother substrate 2 is divided into the individual EL devices 1. The process is described in more detail below.

(I) Organic light-emitting elements, conductive lines, etc. are formed in the unit regions on the mother substrate 2. In order to form organic light-emitting layers and conductive lines, known thin-film forming techniques (vapor deposition and CVD) and photolithography are employed.

(II) Next, a protection film 6 for protecting the organic light-emitting elements, etc. from the outside is formed. The protection film 6 includes a SiN-based, SiO-based or SiON-based material. After the organic light-emitting elements are formed, the protection film 6 is formed over the organic light-emitting elements on the mother substrate 2 entirely excluding some region. Examples of a non protection film region may include a region of a chip-shaped driver 22 (e.g. driving integrated circuits (IC) or the like) 22 for driving the organic light-emitting elements, which is described below.

(III) Subsequently, a sealing member 4, for example, including an epoxy resin, is formed along the inner periphery of each unit region of the mother substrate 2 so as to surround an element region 3. Then, a cover glass sheet 5 is bonded to the mother substrate 2. The epoxy resin constituting the sealing member 4 is applied onto the mother substrate 2 by using a dispenser or the like.

(IV) Then, the mother substrate 2 is divided. That is, cut portions 11a and 12a are made along the dividing lines 11 and 12 of the mother substrate 2 and the cover glass sheet 5, respectively, and then an impact, external force or the like is applied to the cut portions, and thereby, the mother substrate 2 and the cover glass sheet 5 are broken along the dividing lines 11 and 12, respectively. Another dividing method may be used in which laser irradiation is performed along the dividing lines 11 and 12 of the mother substrate 2 and the cover glass sheet 5 to locally heat the mother substrate 2 and the cover glass sheet 5, respectively, thereby intentionally making cracks or the like, and dividing is performed.

When the mother substrate 2 is divided in such a manner, as schematically shown in FIG. 2, cracks 13 may occur in the protection film 6 due to the impact or external force. In some cases, the cracks 13 may extend from the outer edge of the substrate 14 of the EL device 1 into the element region 3 sealed by the sealing member 4.

In this specification, the term "cracks in the protection film 6" conceptually includes cracks in the protection film 6 itself and cracks occurring between the protection film 6 and a film 15 under the protection film 6. Furthermore, the cracks 13 may be made not only during the dividing of the mother substrate 2 but also due to an impact, external force or the like applied to the EL device 1 after dividing has been performed.

Under these circumstances, the inventors have found that, stopping the propagation of the cracks 13 in the protection film 6 improves the reliability and the yield of the EL devices 1.

Embodiments

Figure 3:
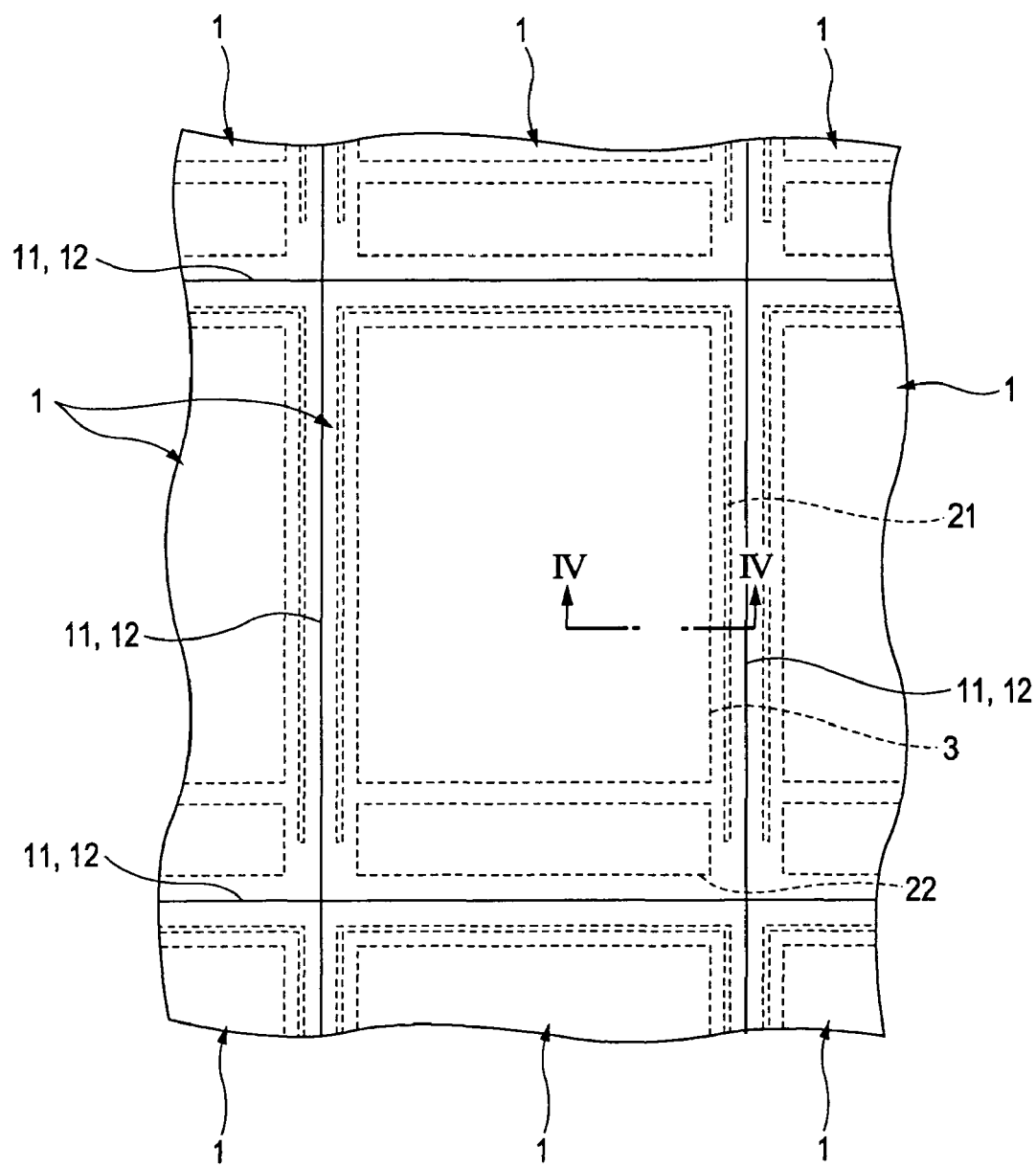
FIG. 3 is a plan view showing an EL device according to an embodiment of the present invention, in a state before being separated.
Figure 4:
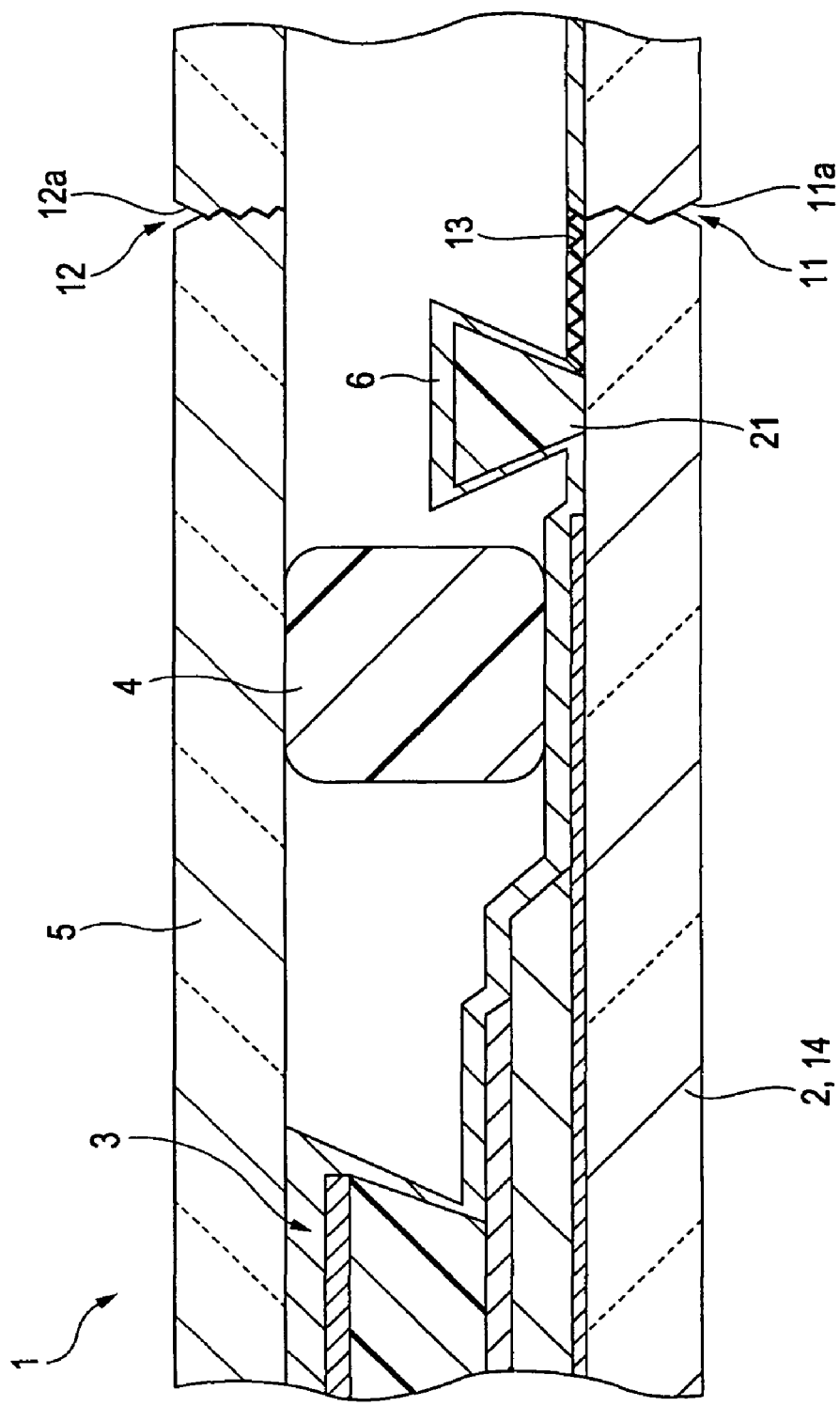
FIG. 4 is a cross-sectional view taken along the line IV-IV of FIG. 3.
Figure 5:
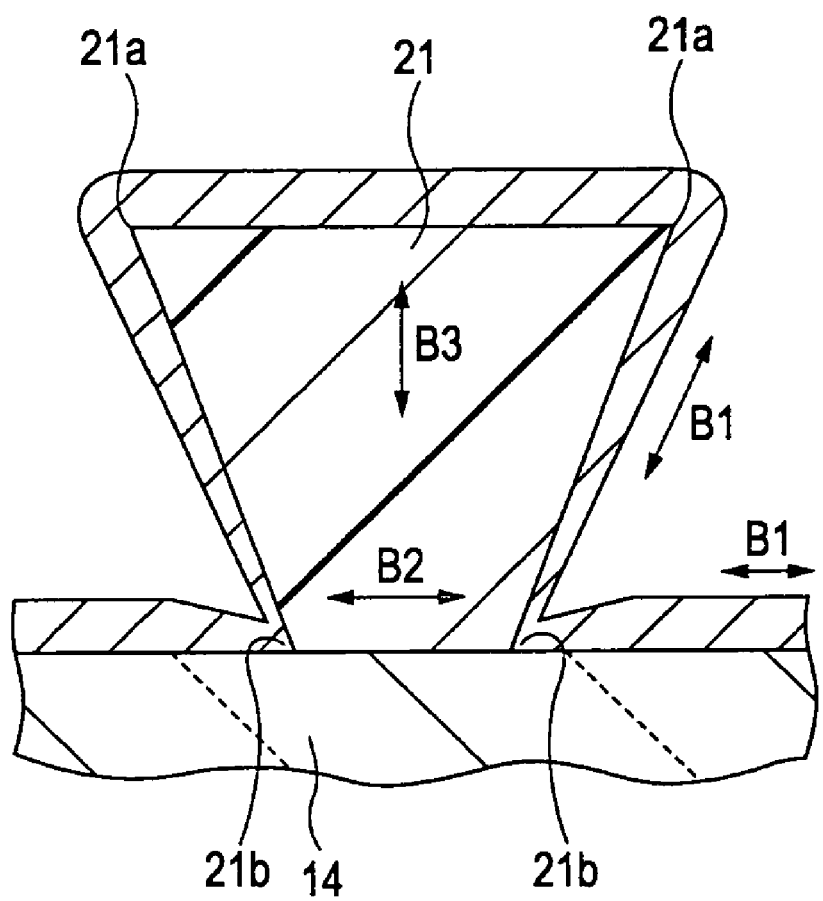
FIG. 5 is an enlarged cross-sectional view showing a protruding section and its vicinity shown in FIG. 4.

FIG. 3 is a plan view showing an EL device according to an embodiment of the present invention before a dividing step, FIG. 4 is a cross-sectional view taken along the line IV-IV of FIG. 3, and FIG. 5 is an enlarged cross-sectional view showing a protruding section and its vicinity shown in FIG. 4. In the structure shown in FIGS. 3 and 4, the same reference numerals are used for the same components as those in FIGS. 1 and 2, and a description thereof is omitted.

In an EL device 1 according to this embodiment, as shown in FIGS. 3 to 5, a protruding section 21 that protrudes upward from the upper surface of the substrate 14 is disposed outside the element region 3. The protruding section 21 reduces the probability that the cracks 13 in the protection film 6 made at the end portion of the substrate 14 reaches the element region 3. The protruding section 21 has a substantially elongated shape along the side of the substrate 14. Consequently, the protection film 6 is in close contact with the surface of the protruding section 21. Furthermore, the sides of the substrate 14 substantially-correspond to dividing lines 11 of the mother substrate 2, and when the mother substrate 2 is divided along the dividing lines 11, the sides of the substrate 14 are formed. The term "substantially elongated shape" refers to an elongated shape formed along at least a part of the end portion of the substrate 14, and the elongated shape may include meandered line and/or bended line. Furthermore, although the protruding section 21 is preferably disposed along at least two sides, the protruding section 21 along one side may be also available.

Furthermore, depending on the arrangement of a driver 22 for driving organic light-emitting elements, it is determined which side of the substrate 14 the protruding section 21 is disposed along. That is, a driver-mounted region in the substrate 14 has no the protection film 6, and the distance between the side of the substrate 14 and the element region 3 is large so that a space can be secured for arranging the driver 22 therebetween. Consequently, the driver-mounted region has a relatively low possibility that cracks 13 in the protection film 6, made at the outer edge of the substrate 14 reach the element region 3, therefore, it is not always necessary to form the protruding section 21 in the driver-mounted region.

Accordingly, in this embodiment, the protruding section 21 is disposed along the sides in which the driver 22 is not arranged, and thus an increase in size of the EL device 1 is suppressed. In the example shown in FIG. 3, since the driver 22 is arranged along one side of the substrate 14, the protruding section 21 is disposed along the remaining three sides. Besides the structure shown in FIG. 3, the driver 22 may be disposed along two or three sides of the substrate 14. As a modification example of the embodiment, regardless of the presence or absence of the driver 22, the protruding section 21 may be disposed along the four sides, i.e., entire perimeter, of the substrate 14.

As shown in FIGS. 4 and 5, such a protruding section 21 has a reverse tapered cross-section in which the upper surface is wider than the lower surface. As a material for the protruding section 21, in view of impact and stress relief, a soft material, such as a resin material (e.g., novolac resin, acrylic resin or polyimide resin) may be used.

The protruding section 21 reduces the probability that the cracks 13 in the protection film 6, made at the end portion of the substrate 14 by an impact, external force or the like reach the element region 3 at an inner region of the substrate 14.

The principle of arresting cracks by means of the protruding section 21 is described. By any one of the following three effects or by a combination of two or three of them, the crack arresting effect is believed to be produced.

(1) Since the protection film 6 is formed on top of the protruding section 21 that protrudes from the upper surface of the substrate 14, when an impact or external force is applied to the outer edge of the substrate 14, as shown in FIG. 5, the transmission direction B1 of the impact or force acting on the protection film 6 changes significantly depending on the location of the protruding section 21. This fact is considered to help the protruding section 21 stop the extension of the cracks 13 in the protection film 6, cracks being made at the end portion of the substrate 14. In particular, in this embodiment, since the protruding section 21 has a reverse tapered cross-section, the transmission direction B1 of the impact or force acting on the protection film 6 greatly changes at the lower portion of the protruding section 21, and thus a deterrent effect of the extension of the cracks is expected.

(2) Due to the variations in the thickness of the protruding section 21, the protection film 6 inevitably has a small thickness portion at corners 21a on the surface of the protruding section 21 and at corners 21b formed by the sidewalls of the protruding section 21 and the upper surface of the substrate 14 when the protection film 6 is formed by vapor deposition or CVD. As a result, since the propagation of the impact or force is suppressed or discontinued at the small thickness portion, an effect of preventing cracks of the protection film 6 from extending over the small thickness portion can be expected. In particular, in the embodiment, since the protruding section 21 has a reverse tapered cross-section, it is possible to effectively decrease the thickness of the protection film 6 formed on the surface of the lower portion in the protruding section 21 (i.e., corners 21b formed between the surface of the protruding section 21 and the upper surface of the substrate 14) when the protection film 6 is formed by vapor deposition method or CVD method. Consequently, it is expected that an increased effect of preventing the extension of cracks at portions of the protection film 6 having a small thickness can be achieved.

(3) In the case where the protruding section 21 includes a resin, when an impact or external force is applied to the end portion of the substrate 14 in the EL device 1, the protruding section 21 easily undergoes elastic deformation, and thus the impact or force acting on the protection film 6 is relieved. Consequently, it may be expected that the protruding section 21 arrests the cracks 13 in the protection film 6, made at the end portion of the substrate 14. Examples of variations in the elastic deformation of the protruding section 21 due to the impact and external force include, as shown in FIG. 5, a deformation pattern in which the thickness of the protruding section 21 in the direction B2 parallel to the substrate 14 increases and decreases, a deformation pattern in which the thickness of the protruding section 21 in the direction B3 perpendicular to the substrate 14 increases and decreases, and combinations of these deformation patterns.

Figure 12A:
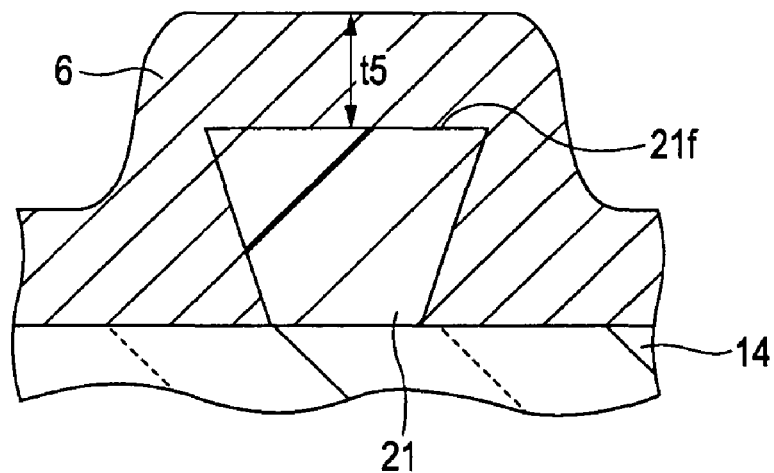
FIG. 12A is a cross-sectional view showing a protruding section and the thickness of a protection film.

In view of the above effect (1), preferably, the height of the protruding section 21 is larger than the thickness of the protection film 6. The thickness of the protection film 6 on the protruding section 21 is described with reference to FIG. 12A. FIG. 12A is a cross-sectional view taken along the line IV-IV of FIG. 3 and is an enlarged view of the protruding section 21. A thickness t5 of the protection film 6 deposited to an upper surface 21f of the protruding section 21 is defined as the thickness of the protection film 6. If the height of the protruding section 21 is smaller than the thickness t5 of the protection film 6, the transmission direction B1 of the impact or force acting on the protection film 6 is less likely to change.

Furthermore, when the protruding section 21 includes, for example, a resin material, the protruding section 21 is formed by a method in which various conductive lines and insulating films are formed on the substrate 14, and then a resin layer is formed on the substrate 14, followed by processing by a known photolithographic technique or the like. After the protruding section 21 is formed, the protection film 6 is formed by vapor deposition so as to cover the element region 3 and the protruding section 21.

Furthermore, the protruding section 21 is not necessarily completely covered by the protection film 6, and the protection film 6 may be disconnected at the sidewall of the protruding section 21. In such a case, propagation of cracks in the protection film 6 stops at the disconnected portion, thus being more preferable.

Furthermore, in case where a partition wall is disposed between the individual organic light-emitting elements on the substrate 14, forming the protruding section 21 composed of the same material as the partition wall at the same step can effectively prevent the EL device fabrication process from being complicated even if the protruding section 21 is formed, and can maintain the high productivity of the EL device.

MODIFICATION EXAMPLES

The modification examples of the structure according to the embodiment described above is described with reference to FIGS. 6A to 6C and FIG. 7.

Figure 6A:
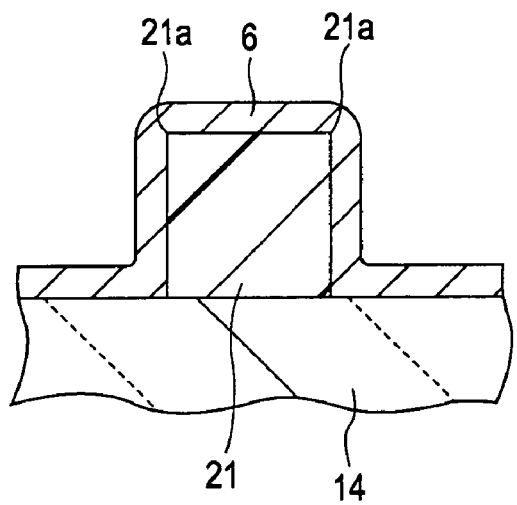
FIGS. 6A to 6C are cross-sectional views showing modification examples of the structure shown in FIG. 5.
Figure 6B:
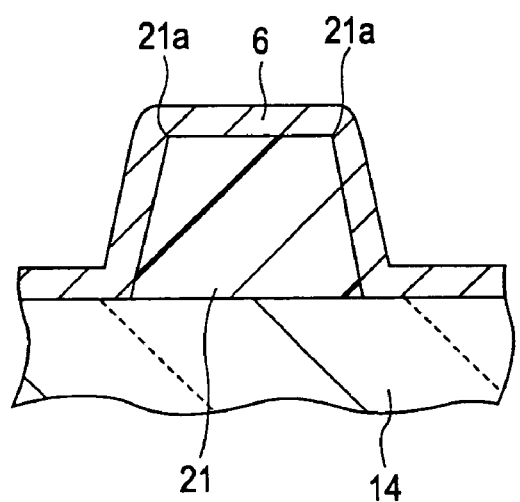

The cross-sectional shape of the protruding section 21 may be substantially rectangular or substantially forward tapered as shown in FIGS. 6A and 6B, and any of various shapes may be employed for the protruding section 21. Even if the protruding section 21 has any of various cross-sectional shapes, when an impact or external force is applied to the outer edge of the substrate 14, the transmission direction of the impact or force acting on the protection film 6 varies significantly depending on the location of the protruding section 21, thereby an restraining effect of the extension of the cracks 13 can be expected. Furthermore, when the protection film 6 is formed, a small thickness portion in the protection film 6 occurs at corners 21a of outer edges of the protruding section 21 and the like. Thus, an effect of preventing the extension of the cracks 13 can be expected at the small thickness portion.

Figure 6C:
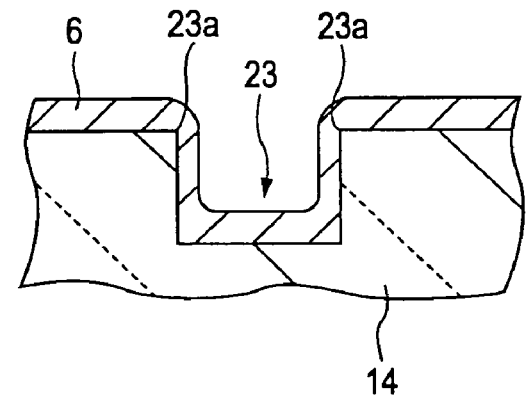

Furthermore, instead of the protruding section 21, a recessed section 23 may be provided as shown in FIG. 6C. Even in such a structure, when an impact or external force is applied to the outer edge of the substrate 14, the transmission direction of the impact or force acting on the protection film 6 varies significantly depending on the location of the recessed section 23. Thus, an effect of preventing the extension of the cracks 13 can be expected. Furthermore, even in the case where the recessed section 23 is provided, a small thickness portion in the protection film 6 occurs at corners 23a of outer edges of the recessed section 23 and the like when the protection film 6 is formed. Thus, an effect of preventing the extension of the cracks 13 can be expected at the small thickness portion. Preferably, the depth G of the recessed section 23 is larger than the thickness of the protection film 6. Furthermore, the distance S between the corners 23a of the recessed section 23 may be twice or more as long as the thickness of the protection film 6 to be deposited on the substrate 14, whereby the protection film 6 can be deposited inside the protection film 23.

Figure 12B:
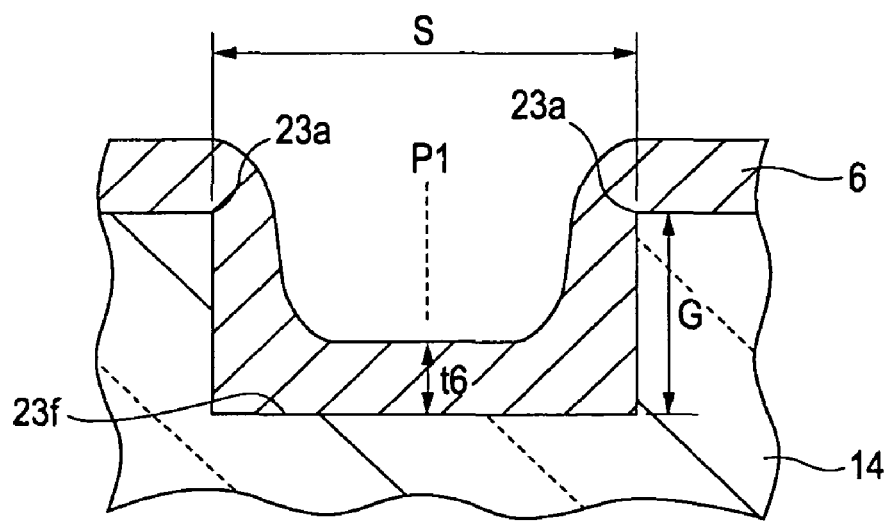
FIG. 12B is a cross-sectional view showing a recessed section and the thickness of a protection film.

The thickness of the protection film 6 deposited on the recessed section 23 is described with reference to FIG. 12B. FIG. 12B is a cross-sectional view taken along the line IV-IV of FIG. 3 and is an enlarged view of the recessed section 23. A thickness t6 of the protection film 6 on a bottom surface 23f of the recessed section 23 at a center P1 between the corners 23a is defined as the thickness of the recessed section 23. If the depth of the recessed section 23 is smaller than the thickness t6 of the protection film 6, the transmission direction B1 of the impact or force acting on the protection film 6 can be less likely to change at the recessed section 23.

Furthermore, as shown in FIG. 7, two protruding sections 21 may be provided. Thereby, the cracks 13 in the protection film 6, generated at the end portion of the substrate 14 can be more reliably difficult to reach the element region 3. As an another modification example, three or more protruding sections 21 can be provided.

Figure 8:
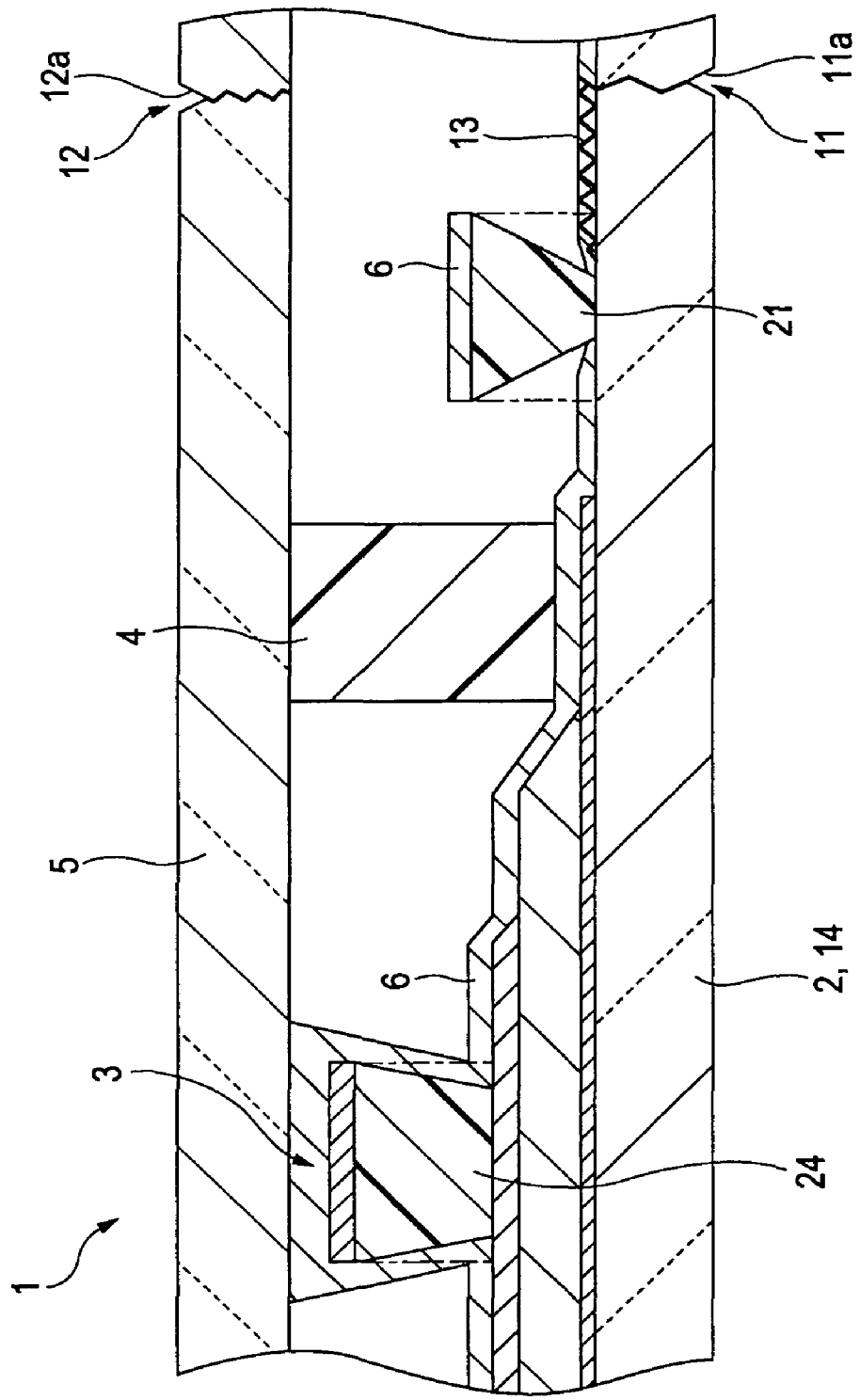
FIG. 8 is a cross-sectional view showing a modification example in the present invention.

Furthermore, as shown in FIG. 8, in the case where a partition wall 24 is arranged between two adjacent organic light-emitting elements and each of the protruding-section 21 and the partition wall 24 has a reverse tapered cross-section, the protruding section 21 has a larger overhang width than the partition wall 24 [(overhang width)=(width of upper surface of partition wall 24 or protruding section 21)—(width of lower surface of partition wall 24 or protruding section 21)]. When the protection film 6 is formed on the protruding section 21 and the partition wall 24 by vapor deposition, CVD or the like from a direction perpendicular to the substrate 14, the upper surface of each of the protruding section 21 and the partition wall 24 functions as a mask entirely or partially, and the material constituting the protection film 6 does not easily cover the region beneath the upper surface of each of the protruding section 21 and the partition wall 24. In particular, since the overhang width of the protruding section 21 is set larger than the overhang width of the partition wall 24, the material constituting the protection film 6 does not easily cover the region beneath the protruding section 21 compared with the region beneath the partition wall 24. Consequently, the thickness of the protection film 6 formed on the substrate 14 can be decreased at the sides of the protruding section 21, or the protection film 6 can be disconnected by the protruding section 21. It is possible to further reduce the possibility that the cracks propagating to the protection film 6 reaches the element region 3. Furthermore, if the overhang width of the partition wall 24 is increased, there is a possibility that the protection film 6 may be disconnected by the partition wall 24 in the element region 3. In such a case, the sealing properties of the protection film 6 decrease. Therefore, the overhang width of the partition wall 24 is preferably smaller. Consequently, in the case where the partition wall 24 is arranged between two adjacent organic light-emitting elements and each of the protruding section 21 and the partition wall 24 has a reverse tapered cross-section, the overhang width of the protruding section 21 is preferably larger than the overhang width of the partition wall 24. Furthermore, preferably, the protection film 6 is continuous in the element region 3 and is separated into a plurality of regions outside the element region.

By employing a known thin-film forming technique, the overhang width of each of the partition wall 24 and the protruding section 21 can be easily set as described above. When the partition wall 24 and the protruding section 21 are formed by processing a negative resist film, for example, the first and second methods described below may be used.

Figure 9A:
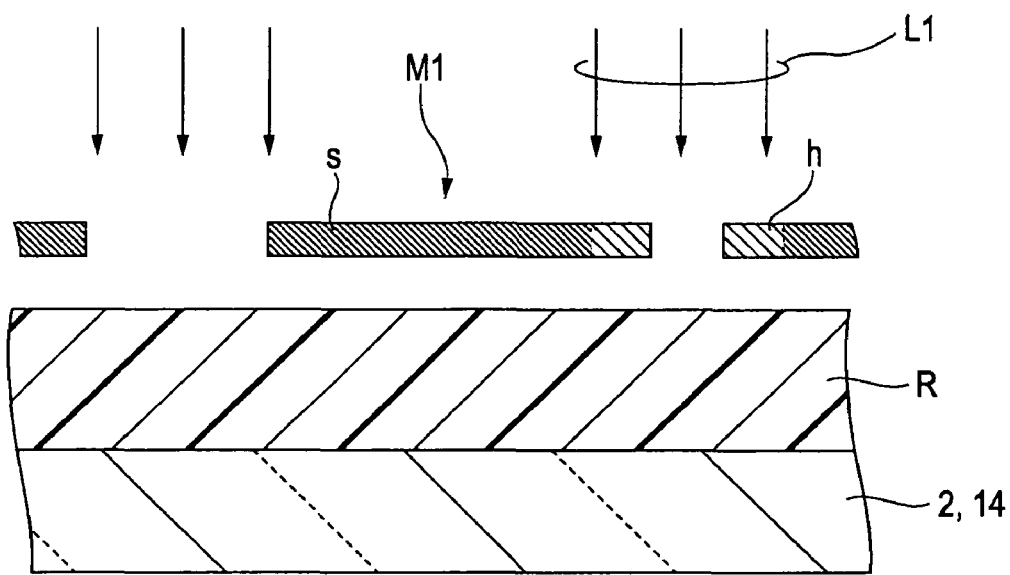
FIGS. 9A and 9B are cross-sectional views illustrating a first method for forming a protruding section and a partition wall shown in FIG. 8.
Figure 9B:
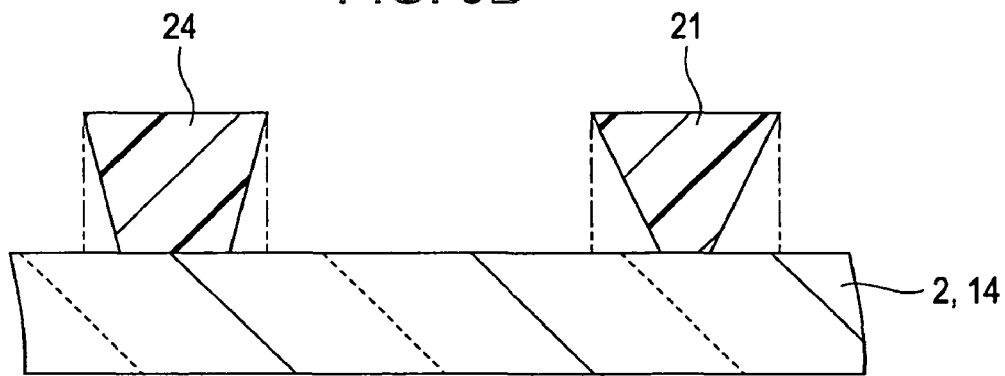

In a first method, as shown in FIGS. 9A and 9B, in an exposure mask M1 used for processing a negative resist film R, a region in the periphery of an opening O1 (FIG. 13) is set to be a halftone region h through which light can be passed by an amount smaller than the amount of light passed through the opening O1, and such a halftone region h is set larger for the protruding section 21 than the partition wall 24. According to this method, since the amount of light passing through the halftone region is small, light L1 does not easily reach the lower portion of the negative resist film R. As a result, in the halftone region h, the lower portion is removed and the upper portion remains. Thus, the overhang width of the protruding section 21 becomes larger than the overhang width of the partition wall 24.

Furthermore, gradual decrease in the amount of light transmitted through the halftone region h with distance from the opening can make a satisfactory reverse tapered shape. In addition, exemplary methods for realizing the halftone region h include a method in which many fine openings O2 having a diameter smaller than the resolution of an exposure device are formed in the halftone region h, a method in which, in the exposure mask M1, the material constituting the halftone region h is designed to have lower light-shielding properties than the material constituting a light-shielding region s, and a method in which the optical density of each of the material for the halftone region h and the material for the light-shielding region s is adjusted so that the halftone region h has lower light-shielding properties than the light-shielding region s.

Figure 13:
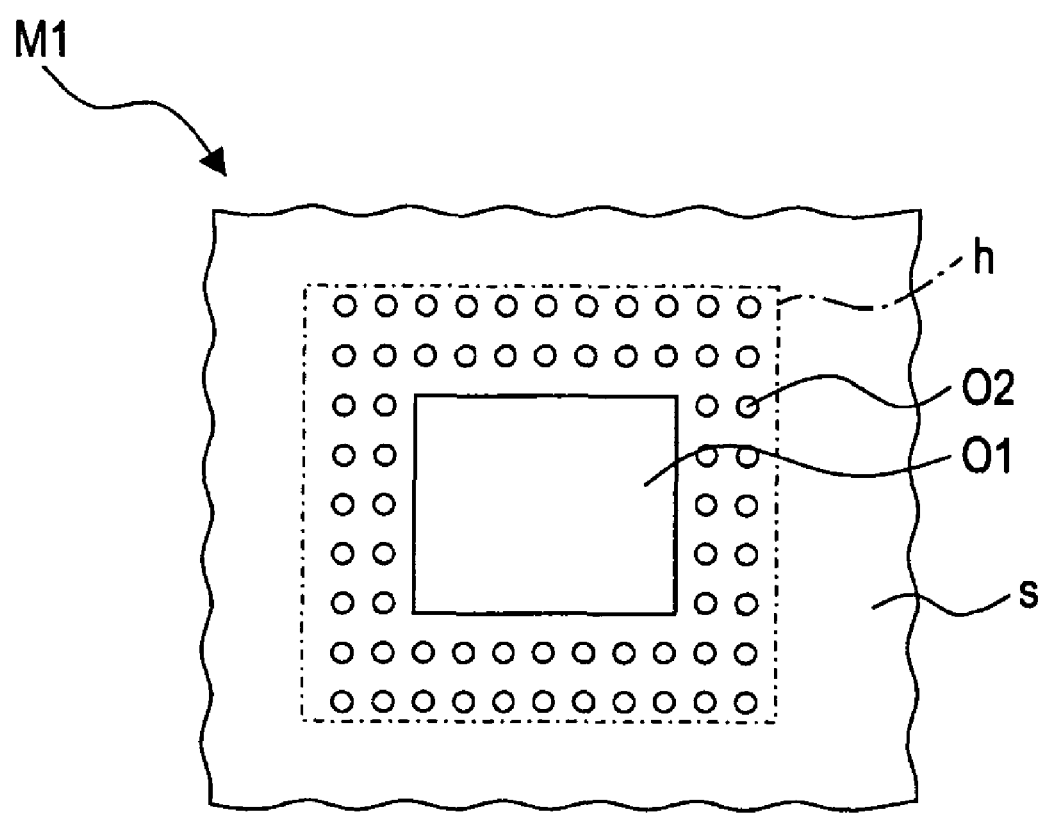
FIG. 13 is a plan view showing an exposure mask having a halftone region.

As shown in FIG. 13, in the exposure mask M1 having the halftone region h, many fine openings O2 are formed in the halftone region h which is located in the periphery of the opening O1.

Figure 10A:
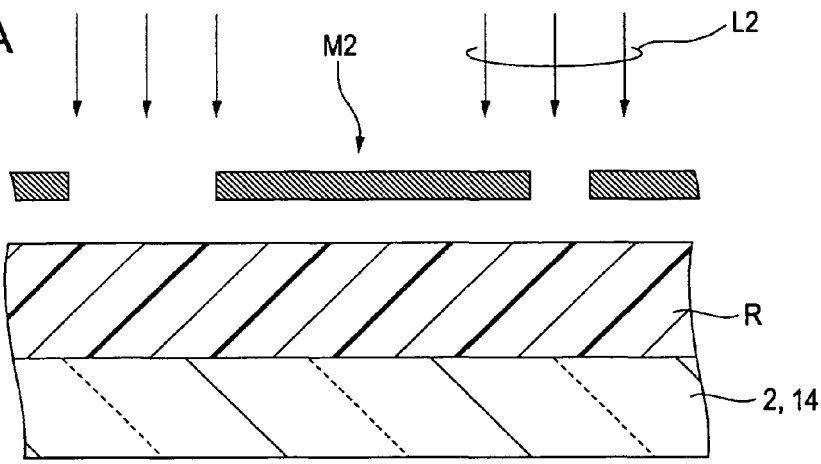
FIGS. 10A to 10C are cross-sectional views illustrating a second method for forming a protruding section and a partition wall shown in FIG. 8.
Figure 10B:
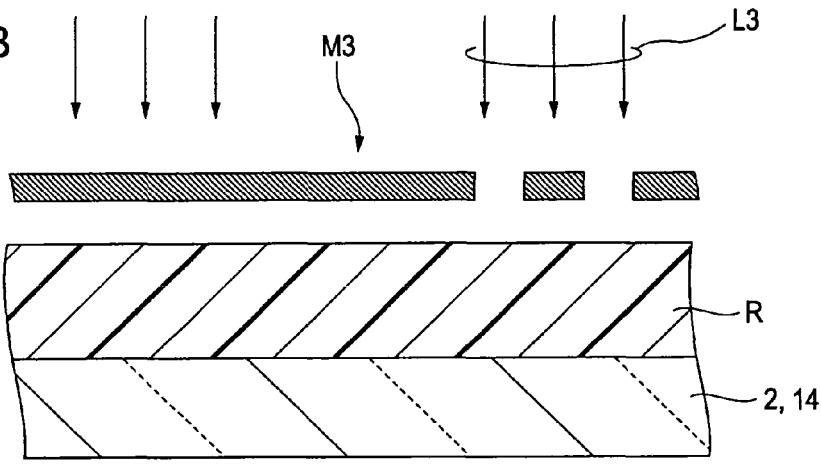
Figure 10C:
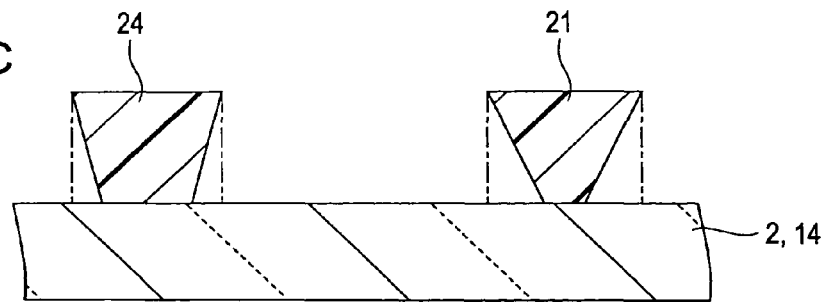

In a second method, as shown in FIGS. 10A to 10C, when the partition wall 24 and the protruding section 21 are formed, the negative resist film R is subjected to a plurality of exposures. For example, when twice exposures are performed, in the first exposure step, using an exposure mask M2, light L2 is irradiated to regions corresponding to the lower surface of the partition wall 24 and the lower surface of the protruding section 21 at a predetermined intensity (first intensity) (refer to FIG. 10A). In the second exposure step, using an exposure mask M3, light L3 is irradiated to regions corresponding to the sidewalls of the partition wall 24 and the protruding section 21 at an intensity lower than the first intensity (refer to FIG. 10B). In the second exposure step, since the intensity of the irradiated light is low, light is difficult to reach the lower portion of the resist film R. Since the lower portion of the resist film R is finally removed, each of the partition wall 24 and the protruding section 21 has a reverse tapered shape. If the resist film R irradiated in the second exposure step has a larger width in the region corresponding to the protruding section 21 than in the region corresponding to the partition wall 24, the overhang width of the protruding section 21 becomes larger than the overhang width of the partition wall 24 (refer to FIG. 10C).

In FIGS. 9A and 9B and FIGS. 10A to 10C used for describing the first and second methods, the structure of the EL device 1 other than the mother substrate 2, the partition wall 24, and the protruding section 21 is omitted so that a focus is placed on the formation of the partition wall 24 and the protruding section 21.

Furthermore, when the partition wall 24 is formed using the exposure mask M1, for example, the width of the upper surface is in a range of 7 to 12 µm, the width of the lower surface is in a range of 5 to 10 µm, and the height is in a range of 3 to 4 µm. In a cross-section of the partition wall 24 taken in the thickness direction, the inclination angle of the sidewall of the partition wall 24 with respect to the lower surface is, for example, in a range of 55 to 70 degrees. A partition wall having a desired shape can be formed by adjusting the amount of light transmitted through the halftone region of the exposure mask M1.

Figure 11A:
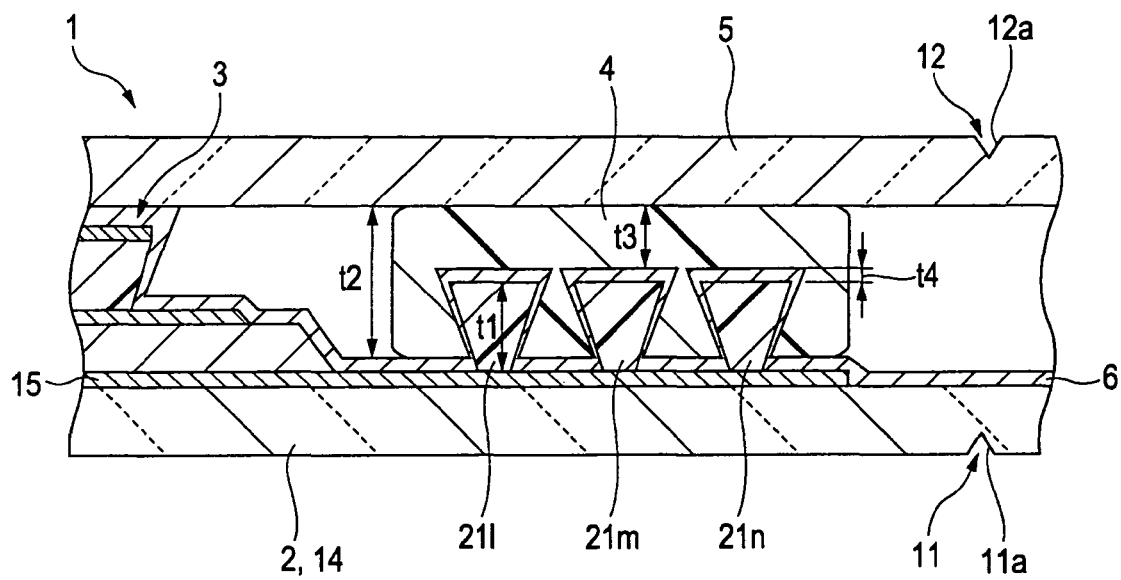
FIG. 11A is a cross-sectional view showing protruding sections in a modification example of the present invention.

Furthermore, as shown in FIG. 11A, protruding sections 21 may be formed in the periphery of an element region 3 and under a sealing member 4. The protruding sections 21 disposed in a region between the sealing member 4 and the outer edge of the substrate 14 in the previous example are arranged in a region where the sealing member 4 is disposed. In this case, since dividing lines 11 and 12 can be formed closer to the element region 3, the distance between the sealing member 4 and each of the dividing lines 11 and 12 can be decreased. Consequently, the area of the non-light-emitting region can be decreased, and it is possible to contribute to the reduction in size of various apparatuses with the organic EL display.

The sealing member 4 includes an elastic material, such as an epoxy resin, as described above. When an impact, external force or the like is applied to the outer edge of the substrate 14 and the propagation of the impact, external force or the like acting on the protection film 6 reaches the sealing member 4, the sealing member 4 undergoes elastic deformation, and thus the propagation of the impact, external force or the like can be reduced. In order to absorb the propagation of the impact, external force or the like acting on the protection film 6, it is preferable to form the protruding sections 21 using an elastically deformable resin material, such as a novolac resin, acrylic resin, or polyimide resin, as described above.

Furthermore, by disposing a plurality of protruding sections (21*l*, 21*m* and 21*n*) under the sealing member 4, the surface area of the protruding sections 21 in the sealing member 4 can be increased, the contact area between the protruding sections 21 and the protection film 6 can be increased, and the length of the protection film 6 from the outer edge of the substrate 14 to the element region 3 of the substrate 14 can be increased, thereby, the propagation of the impact, external force or the like acting on the protection film 6 can be more effectively absorbed by the sealing member 4. Even if cracks in the protection film 6 occur, the increased length of the protection film 6 makes it possible to delay the entry of oxygen or moisture from the interface between the protection film 6 and the sealing member 4.

Furthermore, in order to increase the length of the protection film 6 from the outer edge of the substrate 14 to the element region 3 of the substrate 14, protruding section 21 preferably has a reverse tapered shape in which the lower portion is narrower than the upper portion, instead of a tapered shape in which the upper portion is narrower than the lower portion.

Furthermore, in order to increase the length of the protection film 6 in the sealing member 4, preferably, the thickness t1 of the protruding section 21 is increased so as to come closer to the thickness t2 of the sealing member 4. Consequently, the thickness t3 of the sealing member 4, which is a distance from the upper surface of the protection film 6 covering the upper surface of the protruding section 21 to the cover glass sheet 5, is decreased. Thus, it is possible to reduce the size of the region where the sealing member 4 is disposed, and it is possible to reduce the chance that an impact, external force or the like is applied to the sealing member 4. It is less possible that moisture or oxygen passes through the sealing member 4.

The thickness t1 of the protruding section 21 is larger than the thickness t4 of the protection film 6 on the protruding section 21, and as described above, the protection film 6 can be disconnected in the sealing member 4. Consequently, forming the protection film 6 in a discontinuous manner can make less propagation of the impact, external force or the like acting on the protection film 6.

Figure 11B:
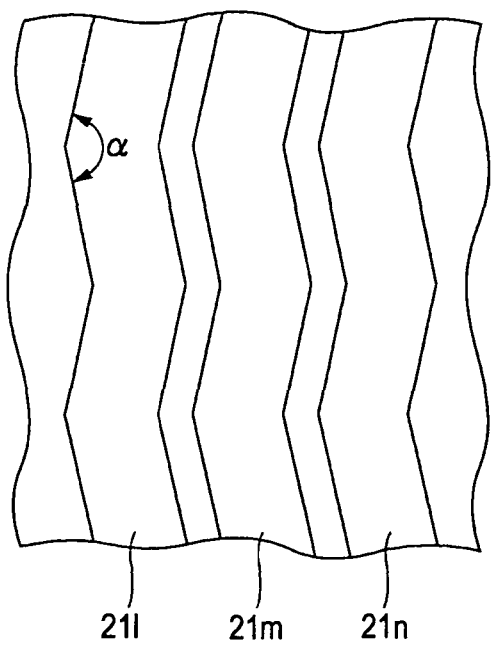
FIG. 11B is a plan view showing the protruding sections.

The impact, external force or the like acting on the protection film 6 propagates with spreading from a point where the external force or the like is applied. However, as shown in FIG. 11B, by forming the protruding sections 21*l*, 21*m*, 21*n* along the end portion of the substrate 14 so as to meander continuously in a plan view, the direction of the impact, external force or the like acting on the protection film 6 can be partially changed so that the impacts, external forces or the like counteract each other, resulting in a reduction of the propagation. Furthermore, rather than forming the protruding sections 21*l*, 21*m* and 21*n* so as to have substantially the same shape in a plan view, forming the protruding sections 21 so that the adjacent protruding sections 21 have different bending angles α makes it possible to more effectively change the direction of the impact or force acting on the protection film 6. The protruding sections 21 can be formed so as to have desired shapes by employing a known thin-film forming technique.

It is to be understood that the invention is not limited to the embodiments described above, and various modifications, improvements, etc. is possible within the scope of the invention.

What is claimed is:

1. An EL device comprising:
a substrate;
an element-forming region provided on an upper surface of the substrate and having organic light-emitting elements;
a protruding section arranged between the element-forming region and an end portion of the substrate; and
a protection film deposited in a region extending from the element-forming region to the end portion of the substrate and disposed so as to cover the protruding section,
wherein the protruding section has sidewalls that are inclined such that the bottom of the protruding section has a smaller width than the top of the protruding section,
wherein the element-forming region further includes a partition wall arranged between two adjacent organic light-emitting elements, each of the partition wall and the protruding section has a reverse tapered cross-section in which the lower surface has a smaller width than the upper surface, and a difference between the width of the upper surface and the width of the lower surface in the protruding section is larger than a difference between the width of the upper surface and the width of the lower surface in the partition wall.

2. An EL device comprising:
a substrate;
an element-forming region provided on an upper surface of the substrate and having organic light-emitting elements;
a recessed section arranged between the element-forming region and an end portion of the substrate; and
a protection film deposited in a region extending from the element-forming region to the end portion of the substrate and disposed so as to cover an inner surface of the recessed section,
wherein the recessed section is disposed in a substantially strip-like shape along the end portion of the substrate,
wherein the element-forming region further includes a partition wall arranged between two adjacent organic light-emitting elements, each of the partition wall and the protruding section has a reverse tapered cross-section in which the lower surface has a smaller width than the upper surface, and a difference between the width of the upper surface and the width of the lower surface in the protruding section is larger than a difference between the width of the upper surface and the width of the lower surface in the partition wall.

3. The EL device according to claim 2, wherein the depth of the recessed section is larger than the thickness of the protection film.

4. An EL device comprising:
a substrate;
an organic light-emitting element on the substrate;
a protruding section arranged in a region between a center portion and an end portion of the substrate; and
a protection film deposited in a region extending from the center portion to the end portion of the substrate and covering the protruding section,
wherein the protruding section is disposed in a substantially strip-like shape along a side of the substrate,
wherein an element-forming region includes a partition wall arranged between two adjacent organic light-emitting elements, each of the partition wall and the protruding section has a reverse tapered cross-section in which a lower surface has a smaller width than an upper surface, and a difference between the width of the upper surface and the width of the lower surface in the protruding section is larger than a difference between the width of the upper surface and the width of the lower surface in the partition wall.

5. The EL device according to claim 2, wherein the element-forming region is surrounded by a sealing member, and the recessed section is located on the end portion of the substrate side of the sealing member.

6. An EL device comprising:
a substrate:
an element-forming region provided on an upper surface of the substrate and having organic light-emitting elements;
a protruding section arranged in a region between the element-forming region and an end portion of the substrate; and
a protection film deposited in a region extending from the element-forming region to the end portion of the substrate and disposed so as to cover the protruding section,
wherein the protruding section is disposed along the end portion of the substrate,
wherein the element-forming region further includes a partition wall arranged between two adjacent organic light-emitting elements, each of the partition wall and the protruding section has a reverse tapered cross-section in which the lower surface has a smaller width than the upper surface, and a difference between the width of the upper surface and the width of the lower surface in the protruding section is larger than a difference between the width of the upper surface and the width of the lower surface in the partition wall.

7. The EL device according to claim 6, wherein the protruding section is composed of a resin.

8. The EL device according to claim 6, wherein the protruding section has sidewalls that are inclined such that the bottom of the protruding section has a smaller width than the top of the protruding section.

9. The EL device according to claim 6, wherein the protruding section is disposed continuously along the end portion of the substrate.

10. The EL device according to claim 6, wherein the protruding section is disposed along the substrate in a plurality of lines.

11. The EL device according to claim 6, wherein the thickness of the protruding section is larger than the thickness of the protection film on the protruding section.

12. The EL device according to claim 6, wherein the element-forming region is surrounded by a sealing member, and the protruding section is covered with the sealing member.

13. An EL device comprising:
a substrate;
an element-forming region provided on an upper surface of the substrate and having organic light-emitting elements;
a recessed section arranged between the element-forming region and an end portion of the substrate;
a protection film deposited in a region extending from the element-forming region to the end portion of the substrate and disposed so as to cover an inner surface of the recessed section; and
a sealing member disposed so as to surround the element-forming region,
wherein the recessed section is covered with the sealing member,
wherein the element-forming region further includes a partition wall arranged between two adjacent organic light-emitting elements, each of the partition wall and the protruding section has a reverse tapered cross-section in which the lower surface has a smaller width than the upper surface, and a difference between the width of the upper surface and the width of the lower surface in the protruding section is larger than a difference between the width of the upper surface and the width of the lower surface in the partition wall.

14. The EL device according to claim 4, wherein the element-forming region is surrounded by a sealing member, and the protruding section is located on the end portion of the substrate side of the sealing member.

15. The EL device according to claim 4, wherein the protruding section is composed of a resin.

16. The EL device according to claim 4, wherein the protruding section has sidewalls that are inclined such that the bottom of the protruding section has a smaller width than the top of the protruding section.

17. The EL device according to claim 4, wherein the protruding section is disposed continuously along the four sides of the substrate.

18. The EL device according to claim 4, further comprising a driving element arranged along at least one of the four sides of the substrate in the region between the element-forming region and the end portion of the substrate, the driving element driving the organic light-emitting elements,
wherein the protruding section is disposed along two or more sides of the substrate not provided with the driving element.

19. The EL device according to claim 4, wherein the protruding section is disposed along at least two of the four sides of the substrate in a plurality of lines.

20. The EL device according to claim 4, wherein the height of the protruding section is set larger than the thickness of the protection film.

21. The EL device according to claim 4, wherein the substrate is obtained by dividing a mother substrate, and the sides of the substrate correspond to dividing lines when the mother substrate is divided.

22. An EL device comprising:
a substrate;
an element-forming region provided on an upper surface of the substrate and having organic light-emitting elements;
a protruding section arranged between the element-forming region and an end portion of the substrate, the protruding section being composed of a resin; and
a protection film deposited in a region extending from the element-forming region to the end portion of the substrate and disposed so as to cover the protruding section,
wherein the protruding section is disposed in a substantially strip-like shape along the end portion of the substrate,
wherein the element-forming region further includes a partition wall arranged between two adjacent organic light-emitting elements, each of the partition wall and the protruding section has a reverse tapered cross-section in which the lower surface has a smaller width than the upper surface, and a difference between the width of the upper surface and the width of the lower surface in the protruding section is larger than a difference between the width of the upper surface and the width of the lower surface in the partition wall.

* * * * *